United States Patent [19]
Tichy et al.

[11] Patent Number: 5,774,349
[45] Date of Patent: Jun. 30, 1998

[54] HIGH-VOLTAGE GENERATOR

[75] Inventors: Peter Tichy, Uttenreuth; Gerhard Nagengast, Eggolsheim; Norbert Wackerbauer, Fuerth; Richard Eichhorn, Hirschaid; Udo Jansohn, Burgthann, all of Germany

[73] Assignee: Siemens Aktiengesellschaft, Munich, Germany

[21] Appl. No.: 720,286

[22] Filed: Sep. 26, 1996

[30] Foreign Application Priority Data

Oct. 16, 1995 [DE] Germany .................. 195 38 488.1

[51] Int. Cl.[6] .................................................. H05G 1/10
[52] U.S. Cl. ........................ 363/68; 363/69; 363/59; 363/126; 378/104; 336/200
[58] Field of Search ................... 363/68, 59, 61, 363/69, 126; 378/101, 104; 336/200; 307/108, 106, 17, 109, 110

[56] References Cited

U.S. PATENT DOCUMENTS

| 4,864,486 | 9/1989 | Spreen | 363/126 |
|---|---|---|---|
| 5,166,965 | 11/1992 | Collier | 378/101 |
| 5,257,304 | 10/1993 | Sireul et al. | 378/101 |
| 5,631,815 | 5/1997 | Cross | 363/68 |

FOREIGN PATENT DOCUMENTS

WO 91/070006 5/1991 WIPO .

*Primary Examiner*—Robert Nappi
*Assistant Examiner*—Shawn Riley
*Attorney, Agent, or Firm*—Hill & Simpson

[57] ABSTRACT

A high-voltage generator for high d.c. voltages, particularly for feeding an x-ray tube has secondary windings applied by a printed technique on printed circuit boards that are held at a common printed circuit board, and which are interconnected thereto in printed technique with components for producing the high-voltage.

4 Claims, 5 Drawing Sheets

HIGH-VOLTAGE GENERATOR

BACKGROUND OF THE INVENTION

1. Field of the Invention

The present invention is directed to a high-voltage generator of the type used in radiology for generating the x-ray tube high-voltage.

2. Description of the Prior Art

An important part of high-voltage generators is a high-voltage transformer that is usually constructed of wire windings. Such a structure, however, is complicated and also causes a complicated circuit structure, for example with rectifiers on the secondary side.

U.S. Pat. No. 4,864,486 discloses a transformer for a rectifier circuit wherein the secondary winding, in printed technique, is applied on a circuit board on which further elements, for example diodes, can also be arranged. Further, PCT Application WO 91/107 006 discloses a voltage multiplier circuit that has a number of printed circuit boards that are layered parallel to one another and that are electrically connected in series for generating a high-voltage.

SUMMARY OF THE INVENTION

The above object is achieved in accordance with the principles of the present invention in a high-voltage generator having a high-voltage transformer with a secondary side formed by windings which are applied on a number of winding circuit boards by a printed technique, the winding circuit boards being mounted in common to a further printed circuit board, serving as a motherboard, and being electrically connected to the motherboard. The motherboard can carry further electrical components for producing the high-voltage, such as capacitors and high-voltage diodes, and can have printed conductor runs thereon for electrically connecting the capacitors and the diodes to each other and to the winding circuit boards. Alternatively, these further electrical components can be mounted on the winding circuit boards.

An important feature of the invention is that the secondary windings are applied on a number of printed circuit boards that are mounted to a motherboard that produces the electrical connections between the individual printed circuit boards and, possibly, further electrical components.

DESCRIPTION OF THE PREFERRED EMBODIMENTS

Figure 1:
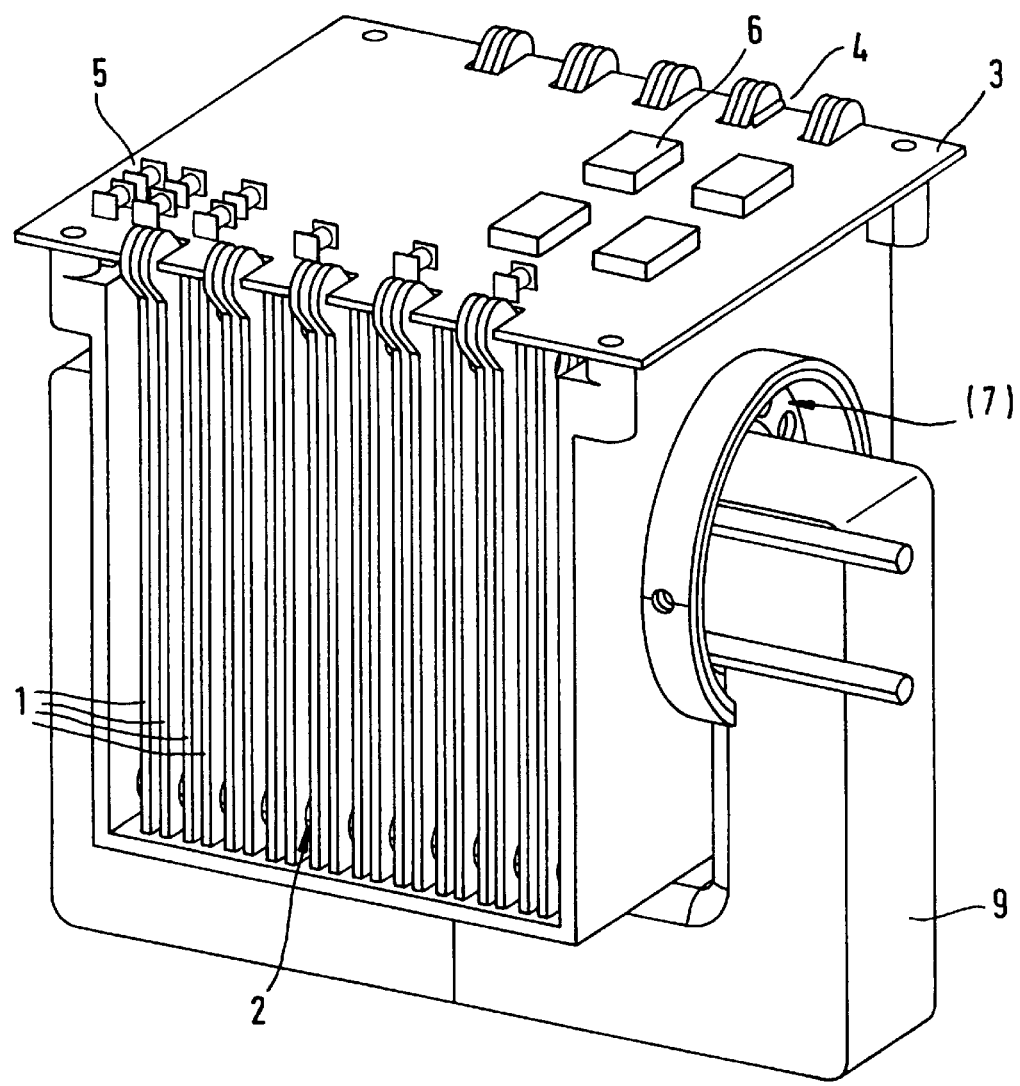
FIG. 1 illustrates the mechanical structure of a high-voltage generator constructed in accordance with the principles of the present invention.

FIG. 1 shows a high-voltage generator with a series of printed circuit boards 1 lying parallel to one another whose spacing from one another is fixed by holders 2 which are held at a printed circuit board (motherboard) 3 that also produces the electrical connections between the printed circuit boards 1. The conductors on the printed circuit board 3 are not visible in FIG. 1, however, a soldered connection 4 for such an electrical connection is shown. FIG. 1 shows that the windings on the printed circuit boards 1 are mechanically fixed with identical spacing from one another and from the transformer core 9.

The secondary winding of the high-voltage generator is composed of turns on the printed circuit boards 1 which can also be implemented as doubly laminated printed circuit boards. A further version of the implementation of the winding of a secondary is a multi-layer printed circuit board that contains the printed turns. The printed circuit board 3 can also expediently serve for mounting electrical components such as high-voltage diodes 5 and high-voltage capacitors 6 that serve the purpose of generating a high d.c. voltage and which are electrically interconnected on the printed circuit board 3. The components 5 and 6 on the printed circuit board 3 are expediently constructed in SMD technique. The mechanical structure is exactly reproducible, so that the electrically relevant values such as inductances and capacitances are known from the outset.

Figure 2:
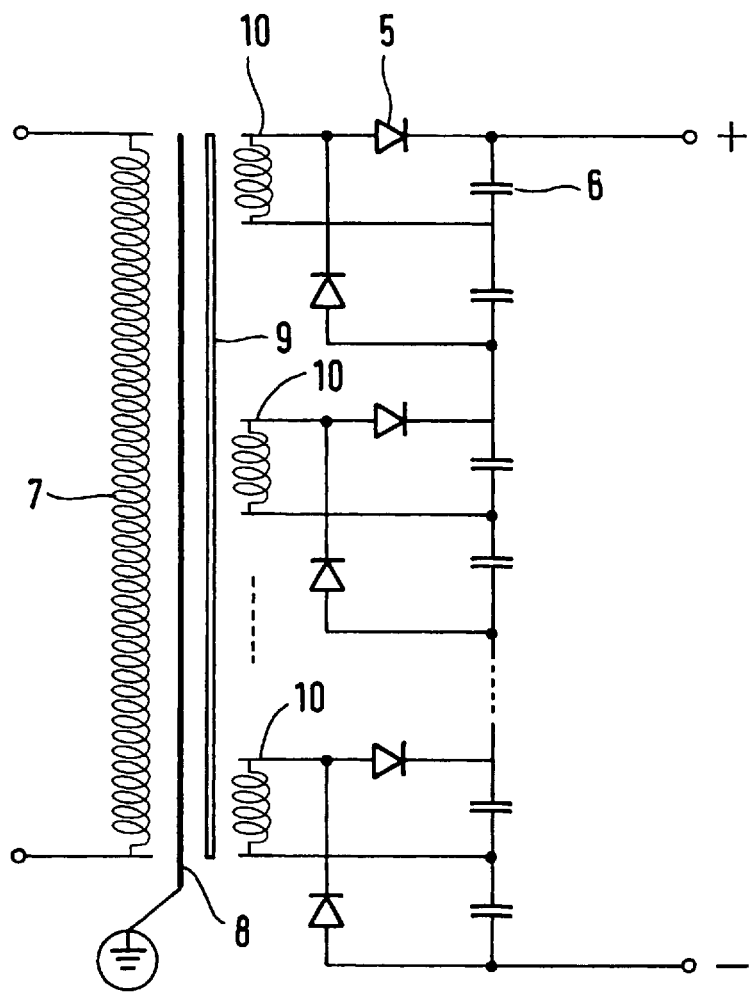
FIGS. 2 and 3 respectively show circuit diagrams for two embodiments of the high-voltage generator of FIG. 1.

FIG. 2 shows a high-voltage generator with a primary winding 7, which is also indicated in FIG. 1, a ground plate 8 for shielding, the core 9 and a series of secondary windings 10 that are applied on the printed circuit boards 1 and which generate a high d.c. voltage with the assistance of high-voltage diodes 5 and high-voltage capacitors 6.

In the embodiment of FIG. 2, the components 5 and 6 are individually allocated to the windings 10.

Figure 3:
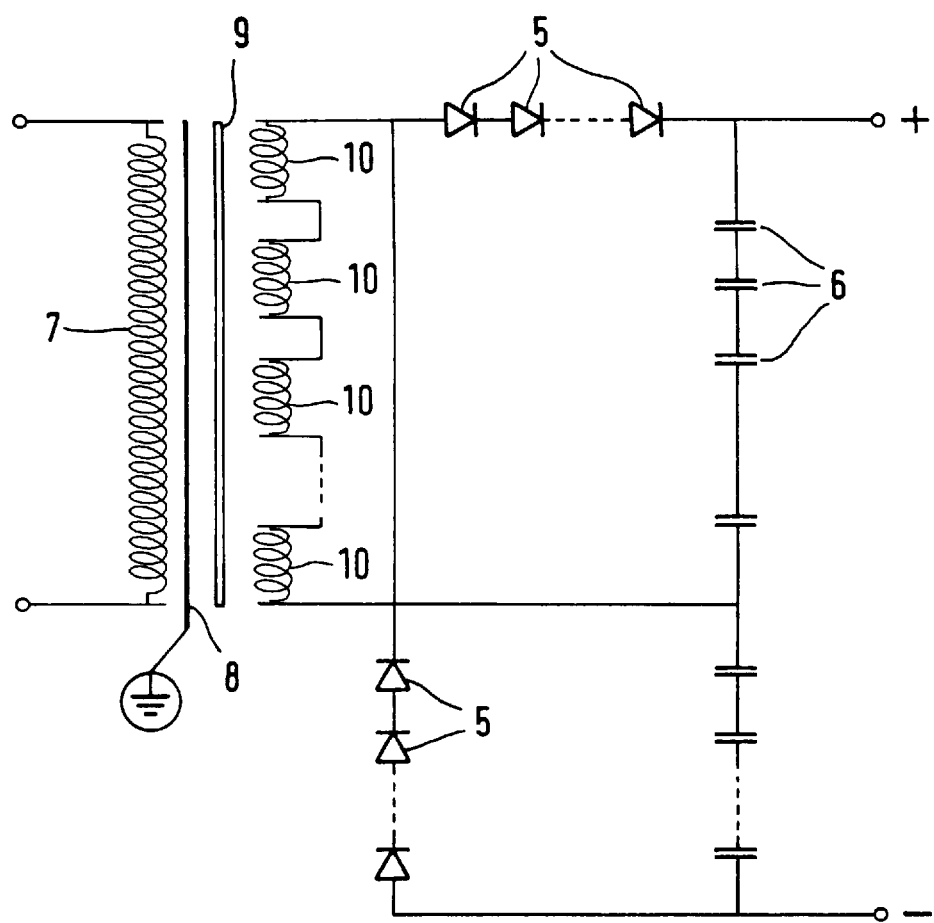

FIG. 3 shows a modified circuit wherein the components 5 and 6 are respectively connected in series branches which are allocated in common to all windings 10.

Figure 4:
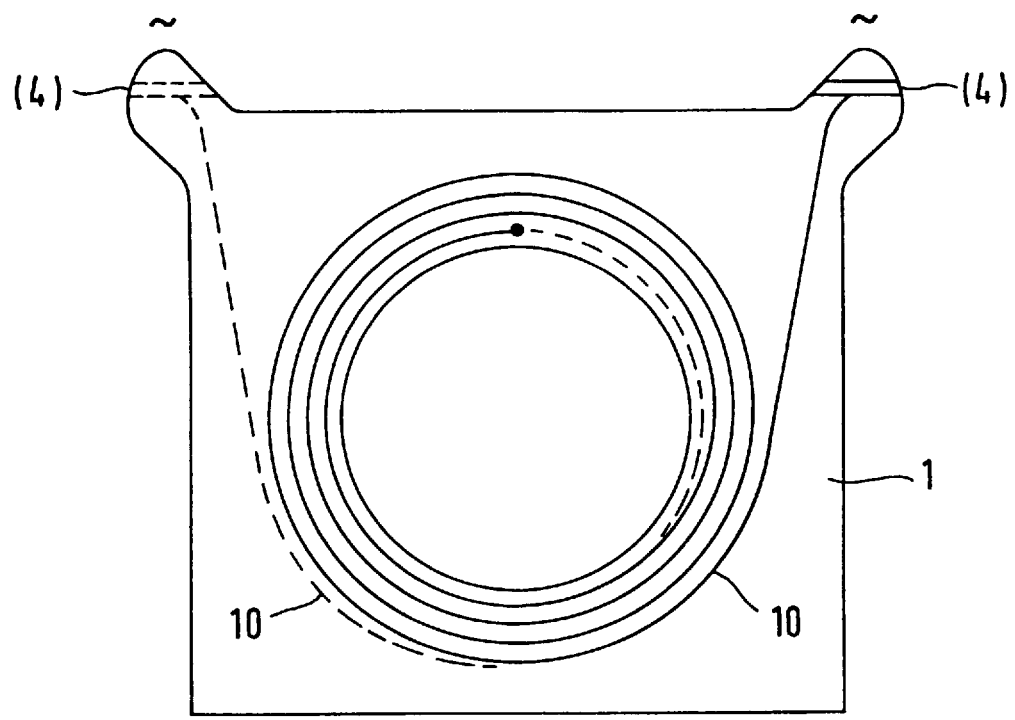
FIGS. 4 and 5 respectively show two versions of a printed circuit board of the high-voltage generator of FIG. 1.

FIG. 4 shows a doubly laminated printed circuit board 1 with the winding 10 applied thereon in printed technique. A second winding 10 indicated with broken lines is applied on the other side of the printed circuit board 1. Two solder points 4 are shown for the electrical connection. As indicated above, the printed circuit board 1 shown here can also be implemented in multi-layer technique for accepting a number of windings 10.

Figure 5:
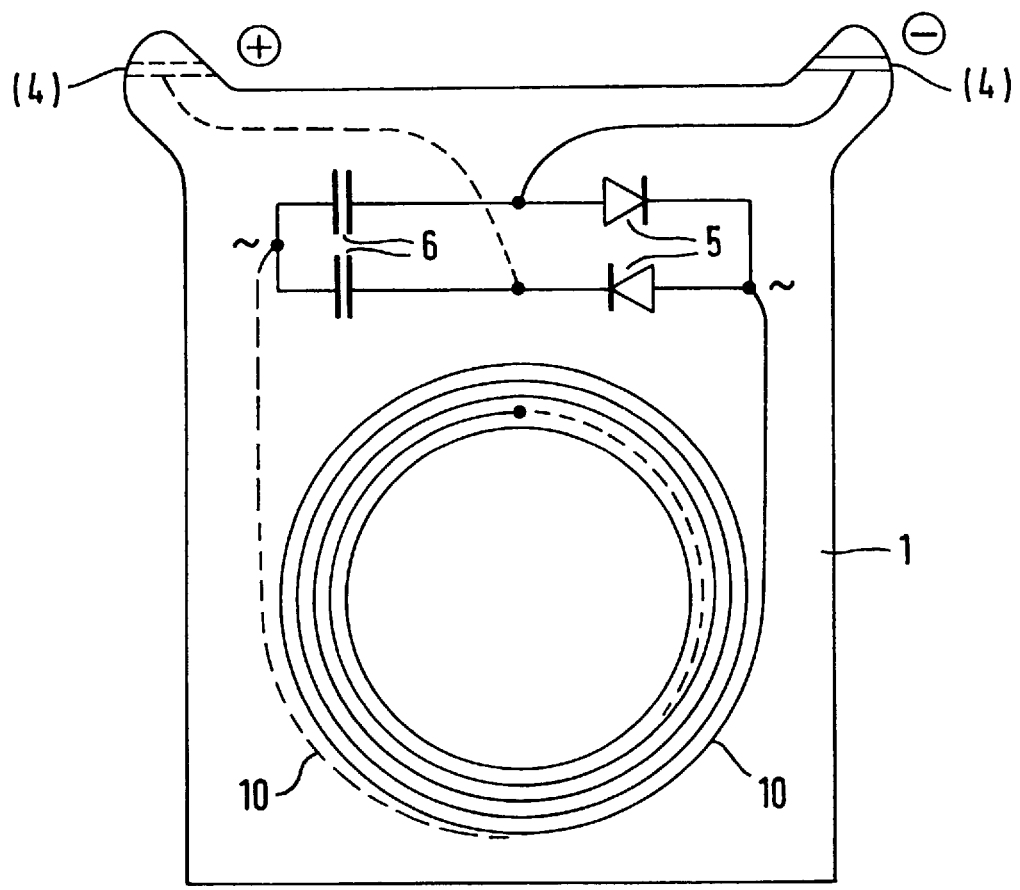

FIG. 5 shows that the high-voltage diodes 5 and high-voltage capacitors 6 are already applied on the printed circuit board and interconnected with the winding 10. Modifications are also possible, i.e. every other printed circuit board 1 can contain only diodes 5 or, respectively, capacitors 6 that are then electrically interconnected with the connector printed circuit board 3.

The high-voltage generator of FIG. 1 can be arranged in an oil-filled housing, the oil serving for high-voltage insulation as well as for heat transport.

Although modifications and changes may be suggested by those skilled in the art, it is the intention of the inventors to embody within the patent warranted hereon all changes and modifications as reasonably and properly come within the scope of their contribution to the art.

We claim as our invention:

1. A high-voltage generator comprising:
    a high-voltage transformer having a secondary side with a plurality of windings;
    a plurality of winding circuit boards, each having at least one of said windings printed thereon; and
    a common circuit board, to which all of said winding circuit boards are mounted so as to project substantially perpendicularly from said common circuit board, and to which all of said winding circuit boards are electrically connected.

2. A high-voltage generator as claimed in claim 1 further comprising a plurality of high-voltage producing electrical components on said common circuit board and conductor runs on said common circuit board connecting said electrical components with the windings on said winding circuit boards.

3. A high-voltage generator as claimed in claim 1 further comprising a plurality of high-voltage producing components, said high-voltage producing components being respectively mounted on said winding circuit boards and being electrically interconnected with the respective windings on said winding circuit boards by printed conductor runs respectively on the winding circuit boards.

4. A high-voltage generator as claimed in claim 1 wherein said high-voltage transformer comprises means for transforming high-voltage for feeding an x-ray tube.

* * * * *